United States Patent
Xin-LeBlanc

(10) Patent No.: US 7,521,963 B1
(45) Date of Patent: Apr. 21, 2009

(54) SYSTEM AND METHOD FOR PROVIDING A LOW STANDBY POWER INTERFACE FOR A LOW VOLTAGE I2C COMPATIBLE BUS

(75) Inventor: Jane Xin-LeBlanc, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 50 days.

(21) Appl. No.: 11/390,014

(22) Filed: Mar. 27, 2006

(51) Int. Cl.
*H03K 19/094* (2006.01)
*H03K 19/0175* (2006.01)
*H03L 5/00* (2006.01)

(52) U.S. Cl. .............................. 326/63; 326/68; 326/80; 326/81; 327/333

(58) Field of Classification Search ............. 326/63, 326/62, 68, 31, 80, 81; 710/105, 305, 106, 710/313
See application file for complete search history.

(56) References Cited

U.S. PATENT DOCUMENTS

| | | | |
|---|---|---|---|
| 5,087,834 A * | 2/1992 | Tsay | 326/33 |
| 6,784,797 B2 * | 8/2004 | Smith et al. | 340/573.4 |
| 7,039,734 B2 * | 5/2006 | Sun et al. | 710/110 |
| 7,202,723 B2 * | 4/2007 | Dreps et al. | 327/205 |
| 2003/0212847 A1 * | 11/2003 | Bandholz et al. | 710/305 |
| 2005/0068062 A1 * | 3/2005 | Yamasaki et al. | 326/81 |

OTHER PUBLICATIONS

Shih-Lun Chen et al., "A New Schmitt Trigger Circuit in a 0.13-μm 1/2.5-V CMOS Process to Receive 3.3-V Input Signals", IEEE Transactions on Circuits and Systems-II: Express Briefs, vol. 52, No. 7, Jul. 2005, pp. 361-365.

Zhenhua Wang, "CMOS Adjustable Schmitt Triggers", IEEE Transactions on Instrumentation and Measurement, vol. 40, No. 3, Jun. 1991, pp. 601-605.

* cited by examiner

*Primary Examiner*—Rexford Barnie
*Assistant Examiner*—Thienvu V Tran

(57) ABSTRACT

A system and method for providing a low standby power interface for a low voltage I2C compatible bus is disclosed. A level shifter circuit is provided that comprises a first input connected to the I2C compatible bus, a second input connected to a busy signal line from an I2C slave module, and an output connected to the I2C slave module. The level shifter circuit increases its bias current in response to a busy signal from the I2C slave module that indicates that the I2C slave module is active. The level shifter circuit changes from its low power mode to a high power mode sufficiently quickly to receive high speed data from a serial data line of the IC2 compatible bus. After the data transfer has been completed, the level shifter circuit returns to a low power mode.

21 Claims, 4 Drawing Sheets

US 7,521,963 B1

SYSTEM AND METHOD FOR PROVIDING A LOW STANDBY POWER INTERFACE FOR A LOW VOLTAGE I2C COMPATIBLE BUS

TECHNICAL FIELD OF THE INVENTION

The present invention is generally directed to a low standby power interface for a low voltage I2C compatible bus.

BACKGROUND OF THE INVENTION

An I2C bus is a bi-directional two wire bus that is designed to provide efficient communication between integrated circuit (IC) chips. The expression "I2C" stands for "Inter-Integrated Circuit". The expression I2C is sometimes written as "I²C" and referred to as "I-squared C".

An I2C bus comprises two active bi-directional wires and a ground connection. The first wire is a Serial Data line (referred to by the letters SDA). The SDA line carries the data on the I2C bus. The second wire is a Serial Clock line (referred to by the letters SCL). The SCL line carries the clock signals on the I2C bus.

The I2C bus is a multi-master bus. The expression "multi-master" means that more than one integrated circuit (IC) is capable of initiating a data transfer on an I2C bus. An integrated circuit (IC) that initiates a data transfer on an I2C bus is referred to as the Bus Master. During the time that the Bus Master is making a data transfer on the I2C bus, the other integrated circuits (that receive the data transfer) are referred to as Bus Slaves.

The principles of operation of the I2C bus are well known in the art. The operation of the I2C bus is set forth and described in a document entitled I2C Bus Specification (Version 2.1). A data bus that is compatible with the principles of operation of an I2C bus is referred to as an "I2C compatible bus."

Sometimes an I2C compatible bus is used to communicate with a plurality of integrated circuit chips where some of the integrated circuits chips operate on different values of supply voltage. In such a case the lowest value of supply voltage of the integrated circuit chips is chosen to be the supply voltage Vdd for the I2C compatible bus.

For example, one of the integrated circuit chips on an I2C compatible bus may be a ninety nanometer (90 nm) feature sized central processing unit (CPU) chip that operates with a supply voltage of one volt (1.0 V). Other chips may be one half micron (0.5 µm) feature sized power chips that operate on a supply voltage in the range of three and six tenths volts (3.3 V) to five and five tenths volts (5.5 V). In order not to exceed the maximum voltage of the CPU chip, the system I2C compatible bus supply voltage Vdd is chosen to be one volt (1.0 V).

Selecting the I2C compatible bus supply voltage Vdd to have the lowest value of supply voltage (one volt (1.0 V) in the present example) means that the other integrated circuit chips on the I2C compatible bus that require a higher value of supply voltage must level shift the input signals.

Several types of prior art level shifter circuits exist. FIG. 1 illustrates a circuit diagram of one prior level shifter circuit 100. The level shifter circuit 100 comprises three NMOS transistors (M0, M1, M2) and three PMOS transistors (M3, M4, M5) connected together as shown in FIG. 1. PMOS transistor M4 and NMOS transistor M2 are connected together in an inverter configuration. The input signal (designated with the letters "in") is provided to the gate of PMOS transistor M4 and to the gate of NMOS transistor M2. The source of PMOS transistor M4 is connected to an input reference voltage Vdd1. The source of NMOS transistor M2 is connected to the negative supply voltage VSS.

PMOS transistor M3 and PMOS transistor M5 are connected in parallel with each of their sources connected to a positive supply voltage Vdd2. The gate of PMOS transistor M3 is connected to the drain of PMOS transistor M5. The gate of PMOS transistor M5 is connected to the drain of PMOS transistor M3. The drain of PMOS transistor M3 is connected to the drain of NMOS transistor M0. The drain of PMOS transistor M5 is connected to the drain of NMOS transistor M1. The source of NMOS transistor M0 and the source of NMOS transistor M1 are each connected to the negative supply voltage VSS.

The input signal "in" is also provided to the gate of NMOS transistor M0. The output of the inverter circuit formed by PMOS transistor M4 and NMOS transistor M2 is provided to the gate of NMOS transistor M1. The output node (designated "out") of level shifter circuit 100 is connected between the drain of PMOS transistor M5 and the drain of NMOS transistor M1.

The prior art level shifter circuit 100 shown in FIG. 1 performs the level shift function. However, it has a disadvantage in that it requires an additional reference voltage signal Vdd1. It would be desirable to have a level shifter circuit that does not require the use of an additional reference voltage signal.

FIG. 2 illustrates a circuit diagram of another second prior level shifter circuit 200. Level shifter circuit 200 does not require an additional reference voltage signal. However, level shifter circuit 200 does require a standby current. The requirement of a standby current is disadvantageous in that the power consumption of the standby current could be quite significant for large power supply differences and/or high input data rates.

Level shifter circuit 200 comprises three PMOS transistors (M0, M8, M12) and five NMOS transistors (M1, M3, M6, M7, M11) connected together as shown in FIG. 2. NMOS transistor M11 and PMOS transistor M12 are connected together in an inverter configuration. The remaining PMOS transistors (M0 and M8) and the remaining NMOS transistors (M1, M3, M6, and M7) are connected together in a Schmitt trigger configuration.

The prior art level shifter circuit 200 shown in FIG. 2 performs the level shift function. However, it has a disadvantage in that it requires a standby current. It would be desirable to have a level shifter circuit that does not require the use of a standby current.

There is a need in the art for a system and method that can provide an improved level shifter circuit. In particular, there is a need in the art for a system and method that can provide a level shifter circuit that can enable an integrated circuit device to interface with an I2C compatible bus that operates at a power supply voltage that is significantly lower than the power supply voltage of the integrated circuit device.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

The term "controller" means any device, system, or part thereof that controls at least one operation. A controller may be implemented in hardware, software, firmware, or combination thereof. It should be noted that the functionality associated with any particular controller may be centralized or distributed, whether locally or remotely.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 3 through 8, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged electronic device.

Figure 1:
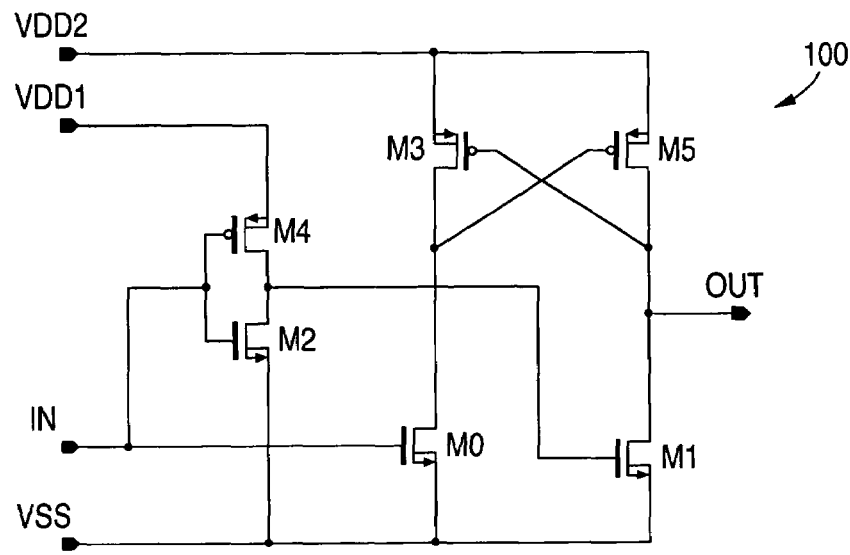
FIG. 1 illustrates a circuit diagram of a prior art level shifter circuit.
Figure 2:
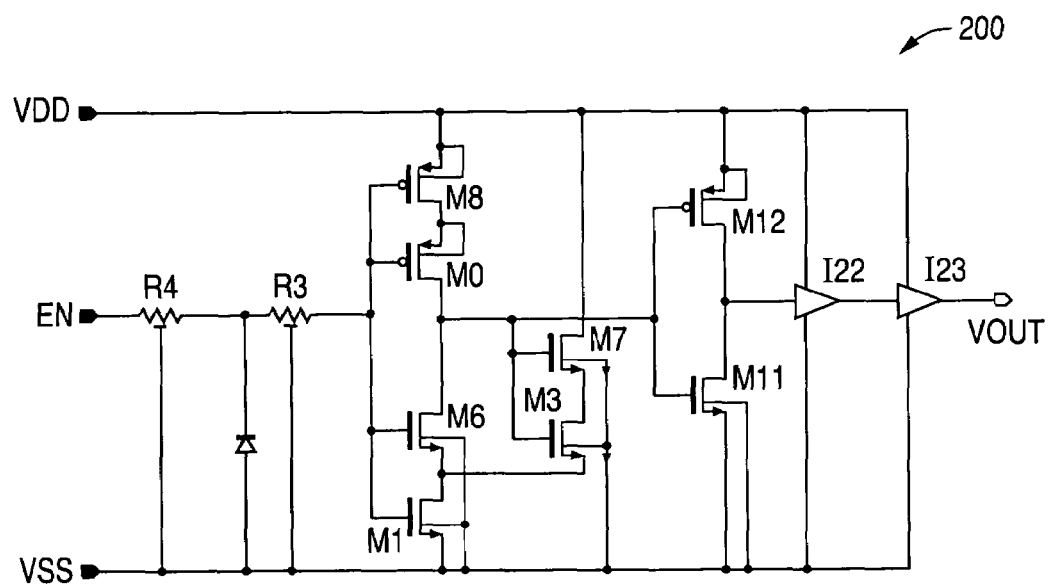
FIG. 2 illustrates a circuit diagram of another prior art level shifter circuit.
Figure 3:
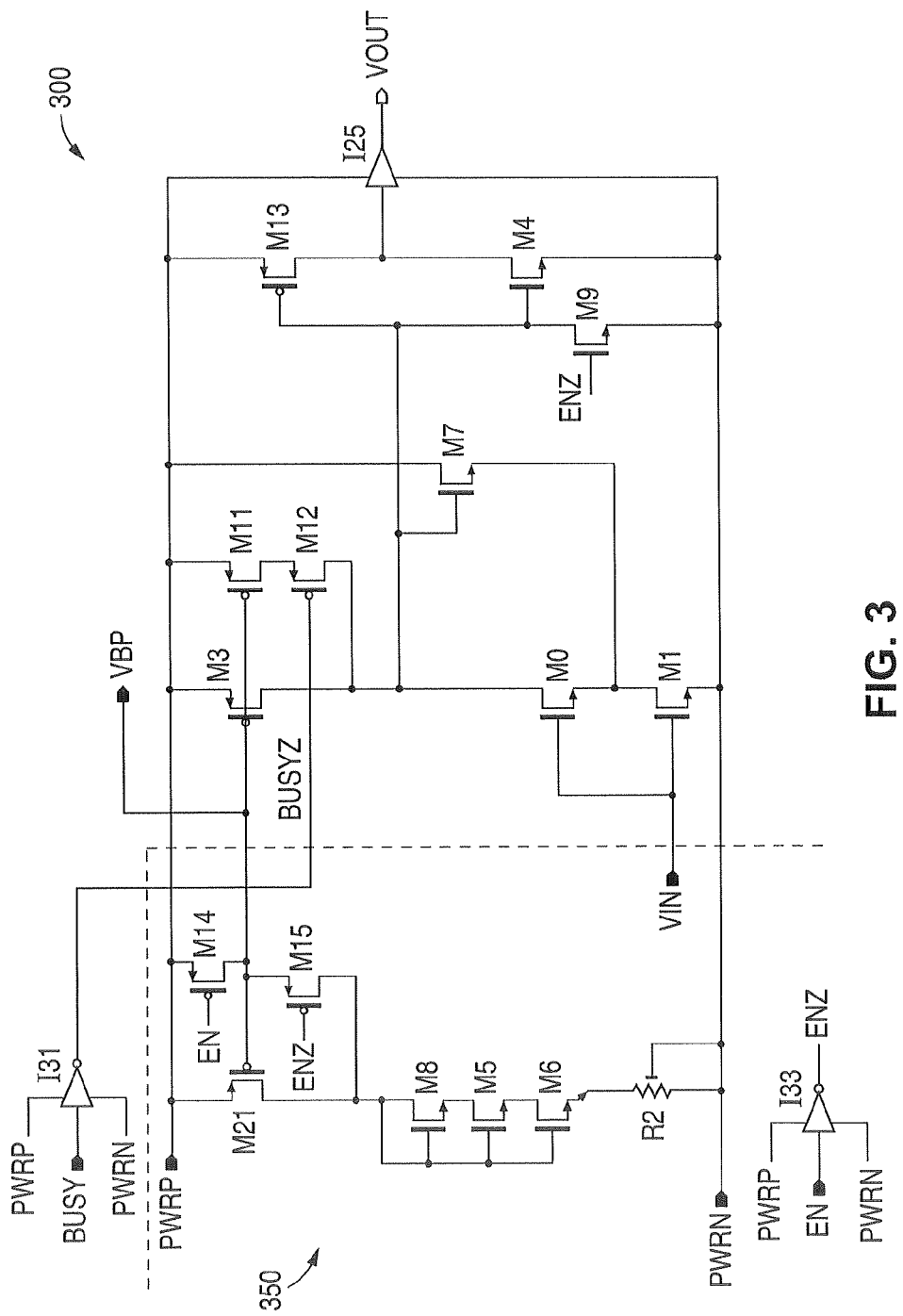
FIG. 3 illustrates a circuit diagram of an advantageous embodiment of a level shifter circuit of the present invention.

FIG. 3 illustrates a circuit diagram of an advantageous embodiment of a level shifter circuit 300 of the present invention. The embodiment of level shifter circuit 300 comprises four PMOS transistors (M3, M11, M12, M13) and five NMOS transistors (M0, M1, M4, M7, M9) connected together as shown in FIG. 3.

NMOS transistor M4 and PMOS transistor M13 are connected together in an inverter configuration. The source of PMOS transistor M13 is connected to the positive power supply (designated with the letters "pwrp"). The drain of PMOS transistor M13 is connected to the drain of NMOS transistor M4. The source of NMOS transistor M4 is connected to the negative power supply (designated with the letters "pwrn"). The gate of PMOS transistor M13 is connected to the gate of NMOS transistor M4. The drain of PMOS transistor M3 and the drain of NMOS transistor M4 are coupled to an output node (designated with the letters "vout") through buffer 125.

As also shown in FIG. 3, the drain of NMOS transistor M9 is connected to the gate of PMOS transistor M13 and to the gate of NMOS transistor M4. The source of NMOS transistor M9 is connected to the negative power supply (designated with the letters "pwrn"). The gate of NMOS transistor M9 is connected to an inverted form (designated with the letters "enz") of an enable signal (designated with the letters "en"). The generation and operation of the enable signal will be described more fully below.

The remaining PMOS transistors (M3, M11 and M12) and the remaining NMOS transistors (M0, M1, and M7) are connected together in a Schmitt trigger configuration. The source of PMOS transistor M3 and the source of PMOS transistor M11 and the drain of NMOS transistor M7 are connected to the positive power supply (designated with the letters "pwrp"). The source of PMOS transistor M12 is connected to the drain of PMOS transistor 11.

The gate of PMOS transistor M3 and the gate of PMOS transistor 11 are connected to a PMOS bias voltage. The generation and operation of the PMOS bias voltage will be described more fully below. The gate of PMOS transistor M12 is connected to an inverted form (designated with the letters "busyz") of a busy signal (designated with the letters "busy"). The generation and operation of the "busy" signal will be described more fully below.

The drain of PMOS transistor M3 and the drain of PMOS transistor M12 and the gate of NMOS transistor M7 are connected to the drain of NMOS transistor M0. The drain of PMOS transistor M3 and the drain of PMOS transistor M12 and the gate of NMOS transistor M7 are also connected to the gate of PMOS transistor M13 and the gate of NMOS transistor M4 in the inverter configuration.

The source of NMOS transistor M0 is connected to the drain of NMOS transistor M1. The source of NMOS transistor M7 is connected to a node that is located between the source of NMOS transistor M0 and the drain of NMOS transistor M1. The source of NMOS transistor M1 is connected to the negative power supply (designated with the letters "pwrn"). The gate of NMOS transistor M0 and the gate of NMOS transistor M1 are connected to an input node (designated with the letters "vin").

When the busy signal is low (i.e., not asserted) the level shifter circuit 300 is in a standby mode (i.e., a low power mode). During the low power mode, the PMOS transistor M3 is active as a P-channel pull-up device. It is designed to be weak in order to reduce the quiescent current that is present during the low power mode. That is, the bias current has a small magnitude. The bias current during the low power mode is just large enough to monitor the input to detect an I2C compatible bus start signal.

When the busy signal is high (i.e., asserted) the level shifter circuit 300 goes into an active mode (i.e., a high power mode). The busy signal turns on the additional P-channel pull-up devices (PMOS transistor M11 and PMOS transistor M12) to increase the bias current to handle normal I2C compatible data transmission.

At a later point in time, when the busy signal returns to a low state (i.e., not asserted), the low state of the busy signal causes the additional P-channel pull-up devices (PMOS transistor M11 and PMOS transistor M12) to turn off. Then the level shifter circuit 300 goes back into the standby mode and the bias current returns to its low value.

The generation and operation of the PMOS bias voltage will now be described. FIG. 3 illustrates an advantageous embodiment of a PMOS bias voltage generator circuit 350. The PMOS bias voltage generator circuit 350 comprises three PMOS transistors (M14, M15, M21) and three NMOS transistors (M5, M6, M8) and a variable resistor R2 connected together as shown in FIG. 3.

The source of PMOS transistor 21 and the source of PMOS transistor M14 are connected to the positive power supply (designated with the letters "pwrp"). The gate of PMOS transistor M14 is connected to the enable signal (designated with the letters "en"). The source of PMOS transistor M15 is connected to the drain of PMOS transistor M14. The gate of PMOS transistor M15 is connected to the inverted enable signal (designated with the letters "enz").

The drain of PMOS transistor M15 is coupled to the drain of PMOS transistor M21. The gate of PMOS transistor M21 and the drain of PMOS transistor M14 and the source of PMOS transistor M15 are connected to the output node of the PMOS bias voltage generator circuit 350 (designated with the letters "vbp"). As previously mentioned, the PMOS bias voltage "vpb" is provided to the gate of PMOS transistor M3 and to the gate of PMOS transistor M11 in the level shifter circuit 300.

The drain of PMOS transistor M15 and the drain of PMOS transistor M21 are both connected to the drain on NMOS transistor M8. The source of NMOS transistor M8 is connected to the drain of NMOS transistor M5. The source of NMOS transistor M5 is connected to the drain of NMOS transistor M6. The drain and the gate of NMOS transistor M8 and the gate of NMOS transistor M5 are connected to the gate of NMOS transistor M6.

The source of NMOS transistor M6 is connected to a first end of variable resistor R2. A second end of variable resistor R2 is connected to the negative power supply (designated with the letters "pwrn").

The PMOS bias voltage generator circuit 350 operates in the following manner. When the enable signal "en" is asserted (en=1) and the inverted enable signal "enz" is not asserted (enz=0), the PMOS transistor M14 is off and the PMOS transistor M15 is on. In this situation the gate and the drain of PMOS transistor M21 have the same potential.

The NMOS transistors M8, M5 and M6 are connected in series to form an effective long channel length NMOS transistor. That is, three (W=1u and L=30u) transistors were connected in series to form one (W=1u and L=90u) transistor. The drain and gate of the effective long length NMOS transistor are also connected together.

PMOS transistors M21, M3 and M11 operate as current mirrors. The currents in PMOS transistors M3 and M11 track the current of PMOS transistor M21. By properly sizing the transistors M21, M8, M5 and M6 and resistor R2, one can generate the desired biases for PMOS transistors M3 and M11.

When the enable signal "en" is not asserted (en=0) and the inverted enable signal "enz" is asserted (enz=1), then the PMOS transistor M14 is on and the PMOS transistor M15 is off. PMOS transistor M14 will pull the gates of PMOS transistors M21, M3 and M11 to supply and turn off the transistors. This will turn off all biases in the level shifter circuit 300 and in the PMOS bias voltage generator circuit 350.

When one desires the circuits 300 and 350 to enter a "power down" mode, one deasserts the enable signal "en" (i.e., sets the enable signal "en" to zero). When one desires the circuits 300 and 350 to leave the "power down" mode, one asserts the enable signal "en" (i.e., sets the enable signal "en" to one).

Figure 4:
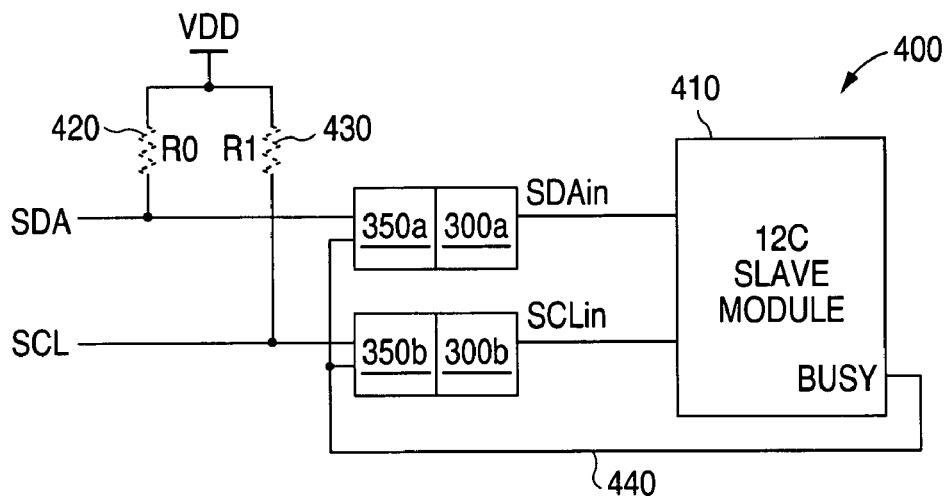
FIG. 4 illustrates a circuit diagram showing a first advantageous embodiment of two level shifter circuits of the present invention connected to an I2C slave module circuit.

FIG. 4 illustrates a circuit diagram 400 showing a first advantageous embodiment of two level shifter circuits (300a and 300b) of the present invention connected to an I2C slave module circuit 410. As shown in FIG. 4, the SDA line of the I2C bus is connected to a first PMOS bias voltage generator circuit 350a. The SDA line is also connected to the supply voltage "vdd" through resistor 420. The SCL line of the I2C bus is connected to a second PMOS bias voltage generator circuit 350b. The SCL line is also connected to the supply voltage "vdd" through resistor 430.

The first PMOS bias voltage generator circuit 350a is connected to the first level shifter circuit 300a in the manner previously shown in FIG. 3. The second PMOS bias voltage generator circuit 350b is connected to the second level shifter circuit 300b in the same manner. In the embodiment shown in FIG. 4, there are two PMOS bias voltage generator circuits (350a and 350b), one for each level shifter circuit (300a and 300b). However, in an alternate advantageous embodiment 500 (shown in FIG. 5) it is possible to utilize only one PMOS bias voltage generator circuit 350 to operate both of the level shifter circuits (300a and 300b).

Figure 5:
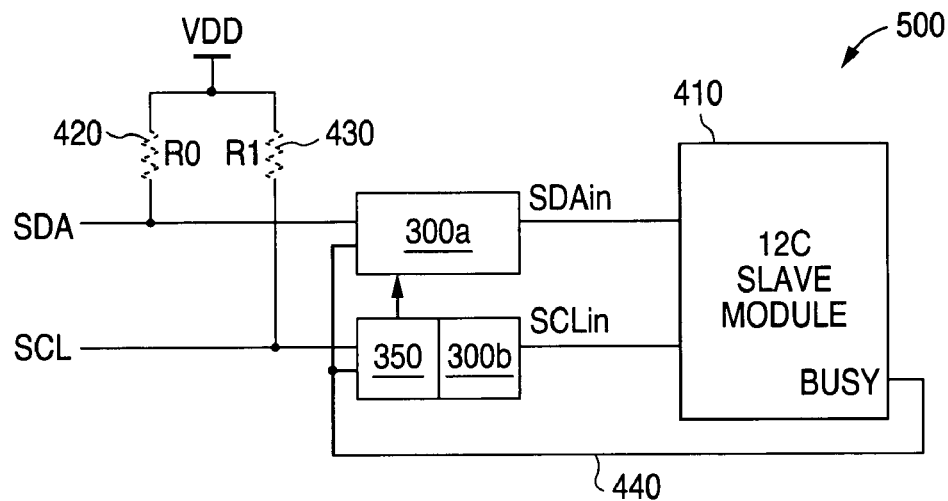
FIG. 5 illustrates a circuit diagram showing a second advantageous embodiment of two level shifter circuits of the present invention connected to an I2C slave module circuit.

As shown in FIG. 4 and in FIG. 5, the output signal of the first level shifter circuit 300a (designated with the letters "SDAin") is provided to the I2C slave module 410. The output signal of the second level shifter circuit 300b (designated with the letters "SCLin") is also provided to the I2C slave module 410. As will be described more fully below, the I2C slave module 410 is capable of utilizing the SDAin signal and the SCLin signal to generate a "busy" signal. The I2C slave module 410 feeds back the "busy" signal to the level shifter circuits (300a and 300b) on signal line 440.

When the I2C compatible bus is idle, the level shifters (300a and 300b) are in standby mode (i.e., low power mode). As soon as the I2C slave module 410 detects a start condition (i.e., when a falling edge of the SDAin signal occurs at a time when the SCLin signal is high), the I2C slave module asserts the "busy" signal (i.e., sets the "busy" signal at a high level). When the I2C slave module 410 later detects a stop condition (i.e., when a rising edge of the SDAin signal occurs at a time when the SCLin signal is high), the I2C slave module deasserts the "busy" signal (i.e., sets the "busy" signal at a low level).

The level shifter circuit 300 of the present invention takes advantage of the fact that in an I2C compatible bus the "clock hold time" after the occurrence of the start condition is much larger than the "data setup time" during regular data transmission. The "clock hold time" (designated "t1") is approximately one thousand two hundred nanoseconds (t1=1200 nS). The "data setup time" (designated "t2") is approximately one hundred nanoseconds (t2=100 nS).

Figure 6:
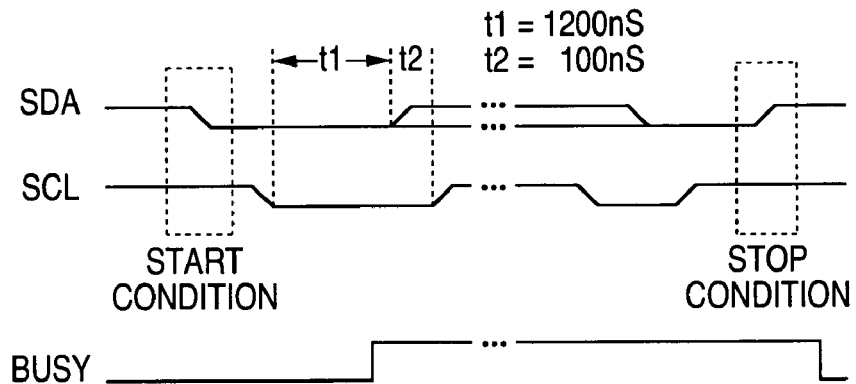
FIG. 6 illustrates timing diagrams for a serial data signal SDA, a clock signal SCL, and a busy signal that may be input to a level shifter circuit of the present invention.

The relative durations of the "clock hold time" and the "data setup time" are shown in FIG. 6. FIG. 6 illustrates the timing diagrams for the serial data signal SDA, the clock signal SCL, and the Busy signal that are input to the level shifter circuit 300 of the present invention. As shown in FIG. 6, the Start Condition occurs when a falling edge of the SDA signal occurs when the SCL clock signal is high. The "clock hold time" ("t1") begins at the falling edge of the SCL clock signal after the Start Condition. The "clock hold time" ("t1") ends at the next rising edge of the SDA data signal. The "data setup time" ("t2") begins at the end of the "clock hold time" ("t1") and ends at the next rising edge of the SCL clock signal.

The relatively large value of "clock hold time" ("t1") makes it possible for the level shifter circuit 300 to pass the Start Condition information through to the I2C compatible slave module 410 sufficiently quickly even when the level shifter circuit 300 is in its standby mode (i.e., its low power mode) with limited speed capabilities. After the level shifter circuit 300 receives the "busy" signal that is fed back from the I2C compatible slave module 410, the level shifter circuit 300 enters active mode by activating the additional PMOS transistors circuits (PMOS transistors M11 and M12 in the embodiment shown in FIG. 3). The level shifter circuit 300 is able to "come alive" (i.e., move from standby mode to active mode) quickly enough in order to be able to receive the subsequent high-speed transfer of data on the SDA line of the I2C compatible bus. As previously mentioned, the level shifter circuit 300 returns to its standby mode after detects the end of the "busy" signal from I2C compatible slave module 410.

Figure 7:
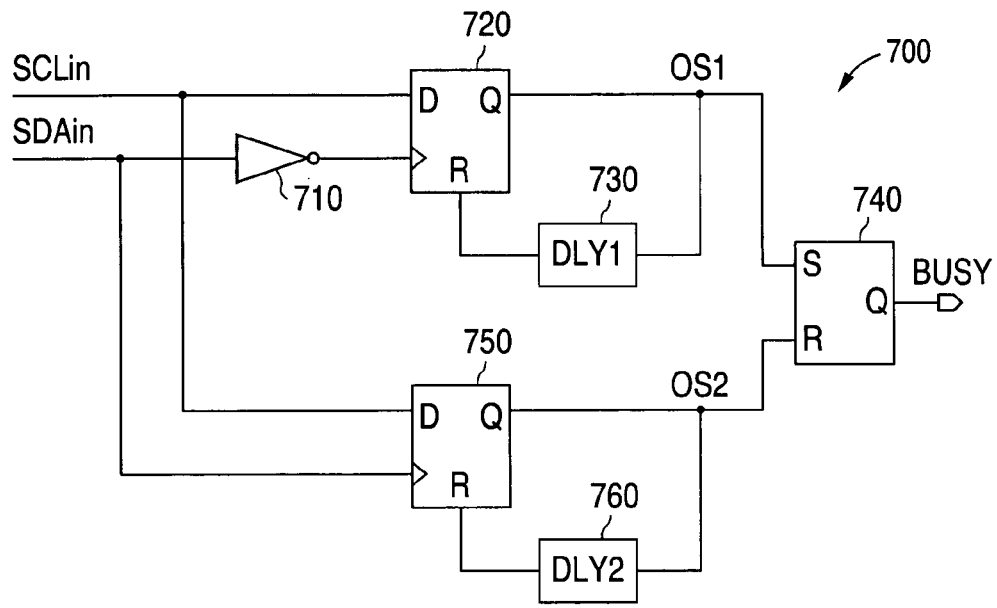
FIG. 7 illustrates a circuit diagram for a circuit that generates a busy signal in an I2C slave module circuit.

The source FIG. 7 illustrates a circuit diagram for a circuit 700 that generates a busy signal in the I2C slave module circuit 410. The circuit 700 comprises an inverter circuit 710, flip-flop circuit 720, delay circuit DLY1 730, Set Reset circuit 740, flip-flop circuit 750, and delay circuit DLY2 760 connected as shown in FIG. 7.

The SCLin clock signal from the level shifter circuit 300b (on the SCL line) is provided to the flip-flop circuit 720 and to the flip-flop circuit 750. The SDAin data signal from the level shifter circuit 300a (on the SDA line) is provided to the flip-flop circuit 750. The SDAin data signal from the level shifter circuit 300a (on the SDA line) is provided to inverter 710 to provide an inverted version of the SDAin data signal to the flip-flop circuit 720.

Flip-flop circuit 720 and delay circuit DLY1 730 generate a one shot (designated "OS1") at the occurrence of the start condition (i.e., the occurrence of a falling edge of the SDAin signal when the SCLin signal is high). Flip-flop circuit 750 and delay circuit DLY2 760 generate a one shot (designated "OS2") at the occurrence of the stop condition (i.e., the occurrence of a rising edge of the SDAin signal when the SCLin signal is high).

Figure 8:
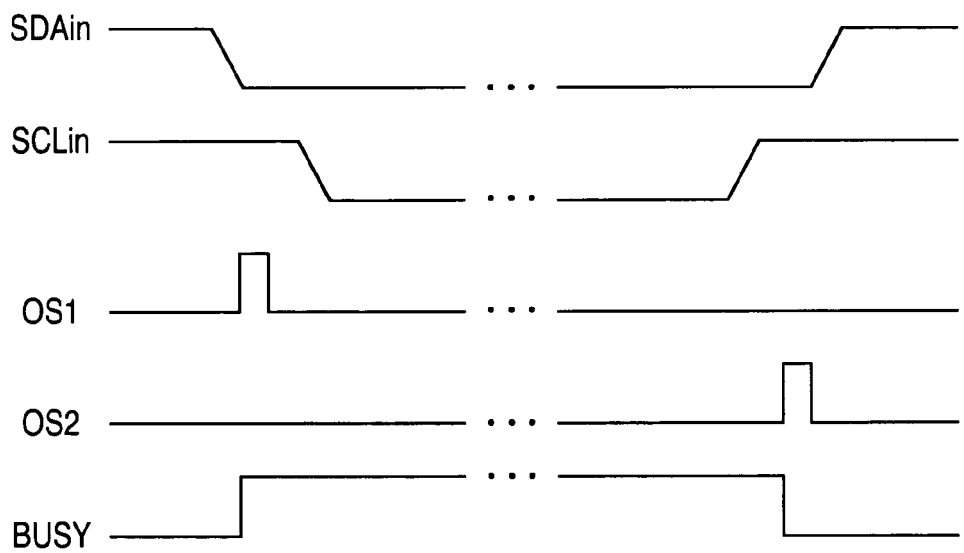
FIG. 8 illustrates timing diagrams showing the operation of the circuit shown in FIG. 7.

The one shot "start" signal OS1 is provided to the Set input of Set-Reset latch 740. The one shot "stop" signal OS2 is provided to the Reset input of Set-Reset latch 740. The Set-Reset latch 740 generates the busy signal for the I2C slave module circuit 410. FIG. 8 illustrates timing diagrams showing the operation of the circuit 700 shown in FIG. 7.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. An apparatus for providing an interface for an I2C slave module, the apparatus comprising:
   a level shifter circuit comprising: (1) a first input connected to an I2C compatible bus, (2) a second input connected to a busy signal line from the I2C slave module, and (3) an output connected to an input of the I2C slave module;
   wherein the I2C compatible bus and the I2C slave module operate using different supply voltage values and the level shifter circuit shifts signals between the I2C compatible bus and the I2C slave module; and
   wherein the level shifter circuit changes a value of bias current in the level shifter circuit in response to a busy signal from the I2C slave module on the busy signal line, wherein the level shifter circuit provides a low power value of bias current when the busy signal from the I2C slave module is not asserted.

2. The apparatus as set forth in claim 1 wherein the low power value of bias current is large enough to monitor an input to the level shifter circuit to detect an I2C compatible bus start condition signal.

3. The apparatus as set forth in claim 1 wherein the level shifter circuit provides a high power value of bias current when the busy signal from the I2C slave module is asserted.

4. The apparatus as set forth in claim 1 wherein:
   the level shifter circuit sends a start condition signal to the I2C slave module when the level shifter circuit is in a low power mode; and
   when the busy signal from the I2C slave module is asserted, the level shifter circuit changes from the low power mode to a high power mode sufficiently quickly to receive high speed data from a serial data line of the I2C compatible bus.

5. The apparatus as set forth in claim 4 wherein the level shifter circuit receives the busy signal from the I2C slave module after the start condition signal and within a clock hold time period.

6. The apparatus as set forth in claim 5 wherein the clock hold time period is approximately one thousand two hundred nanoseconds.

7. The apparatus as set forth in claim 1 wherein the level shifter circuit comprises:
   a Schmitt trigger circuit that comprises at least one N-channel transistor device that receives an input signal and at least one P-channel pull-up device that provides the low power value of bias current; and
   at least one additional P-channel pull-up device coupled to the Schmitt trigger circuit, wherein the at least one additional P-channel pull-up device provides an additional bias current when the busy signal from the I2C slave module is asserted.

8. The apparatus as set forth in claim 7 further comprising a PMOS bias voltage generator circuit that provides a bias voltage (1) to the at least one P-channel pull-up device of the Schmitt trigger circuit, and (2) to the at least one additional P-channel pull-up device.

9. An apparatus for providing an interface for an I2C slave module, the apparatus comprising:
   a first level shifter circuit comprising: (1) a first input connected to a serial data line of an I2C compatible bus, (2) a second input connected to a busy signal line from the I2C slave module, and (3) a serial data line output connected to a first input of the I2C slave module; and
   a second level shifter circuit comprising: (1) a first input connected to a serial clock line of the I2C compatible bus, (2) a second input connected to the busy signal line from the I2C slave module, and (3) a serial clock line output connected to a second input of the I2C slave module;
   wherein the I2C compatible bus and the I2C slave module operate using different supply voltage values and the first and second level shifter circuits shift signals between the I2C compatible bus and the I2C slave module;
   wherein the first level shifter circuit changes a value of bias current in the first level shifter circuit in response to a busy signal from the I2C slave module on the busy signal line, wherein the first level shifter circuit provides a low power value of bias current in the first level shifter circuit when the busy signal from the I2C slave module is not asserted; and wherein the second level shifter circuit changes a value of bias current in the second level shifter circuit in response to the busy signal from the I2C slave module on the busy signal line, wherein the second level shifter circuit provides a low power value of bias current in the second level shifter circuit when the busy signal from the I2C slave module is not asserted.

10. The apparatus as set forth in claim 9:

wherein the low power value of bias current in the first level shifter circuit is large enough to monitor an input to the first level shifter circuit to detect an I2C compatible bus start condition signal; and wherein the low power value of bias current in the second level shifter circuit is large enough to monitor an input to the second level shifter circuit to detect an I2C compatible bus start condition signal.

11. The apparatus as set forth in claim 9:

wherein the first level shifter circuit provides a high power value of bias current in the first level shifter circuit when the busy signal from the I2C slave module is asserted; and wherein the second level shifter circuit provides a high power value of bias current in the second level shifter circuit sa when the busy signal from the I2C slave module is asserted.

12. The apparatus as set forth in claim 9:

wherein at least one of the first level shifter circuit and the second level shifter circuit sends a start condition signal to the I2C the I2C slave module when the first and second level shifter circuits are in a low power mode; and when the busy signal from the I2C slave module is asserted, the first level shifter circuit changes from the low power mode to a high power mode sufficiently quickly to receive high speed data from the serial data line of the I2C compatible bus.

13. The apparatus as set forth in claim 12 wherein the first level shifter circuit and the second level shifter circuit receive the busy signal from the I2C slave module after the start condition signal and within a clock hold time period.

14. The apparatus as set forth in claim 13 wherein the clock hold time period is approximately one thousand two hundred nanoseconds.

15. The apparatus as set forth in claim 9:

wherein the first level shifter circuit comprises a first Schmitt trigger circuit that comprises at least one first N-channel transistor device that receives an input signal and at least one first P-channel pull-up device that provides the low power value of bias current in the first level shifter circuit;

wherein at least one first additional P-channel pull-up device is coupled to the first Schmitt trigger circuit, wherein the at least one first additional P-channel pull-up device provides an additional bias current in the first level shifter circuit when the busy signal from the I2C slave module is asserted;

wherein the second level shifter circuit comprises a second Schmitt trigger circuit that comprises at least one second N-channel transistor device that receives a second input signal and at least one second P-channel pull-up device that provides the low power value of bias current in the second level shifter circuit; and wherein at least one second additional P-channel pull-up is device coupled to the second Schmitt trigger circuit, wherein the at least one second additional P-channel pull-up device provides an additional bias current in the second level shifter circuit when the busy signal from the I2C slave module is asserted.

16. The apparatus as set forth in claim 15 further comprising a PMOS bias voltage generator circuit that provides a bias voltage to at least one of: (1) the at least one first P-channel pull-up device of the first level shifter circuit, and (2) the at least one second P-channel pull-up device of the second level shifter circuit.

17. A method for providing an interface for an I2C slave module the method comprising:

detecting in a level shifter circuit a start condition signal on an I2C compatible bus when the level shifter circuit is in a low power mode, the level shifter circuit having inputs coupled to the I2C compatible bus and the I2C slave module and an output coupled to the I2C slave module;

sending the start condition signal to the I2C slave module when the level shifter circuit is in the low power mode; and upon receiving a busy signal from the I2C slave module that indicates that the I2C slave module is active, increasing a value of bias current in the level shifter circuit and changing from the low power mode to a high power mode in the level shifter circuit;

wherein the I2C compatible bus and the I2C slave module operate using different supply voltage values; and wherein the level shifter circuit shifts signals between the I2C compatible bus and the I2C slave module.

18. The method of claim 17, wherein the level shifter circuit changes from the low power mode to the high power mode sufficiently quickly to receive high speed data from a serial data line of the I2C compatible bus.

19. The method of claim 17, further comprising:

decreasing the value of bias current in the level shifter circuit when the busy signal from the I2C slave module is not asserted.

20. The method of claim 17, wherein the level shifter circuit receives the busy signal from the I2C slave module after the start condition signal and within a clock hold time period.

21. The method of claim 20, wherein the clock hold time period is approximately one thousand two hundred nanoseconds.

* * * * *